United States Patent [19]
Maeshima

[11] Patent Number: 5,168,360
[45] Date of Patent: Dec. 1, 1992

[54] SAMPLING CLOCK GENERATING CIRCUIT FOR A-D CONVERSION OF A VARIETY OF VIDEO SIGNALS

[75] Inventor: Kazuya Maeshima, Nagasaki, Japan

[73] Assignee: Mitsubishi Denki Kabushiki Kaisha, Tokyo, Japan

[21] Appl. No.: 653,412

[22] Filed: Feb. 11, 1991

[30] Foreign Application Priority Data

Mar. 30, 1990 [JP] Japan .................. 2-86274

[51] Int. Cl.$^5$ ............................. H04N 7/04
[52] U.S. Cl. ..................... 358/148; 358/158
[58] Field of Search ........... 358/148, 150, 160, 158; 341/155; 337/1 A, 20

[56] References Cited

U.S. PATENT DOCUMENTS

| | | | |
|---|---|---|---|
| 4,751,565 | 6/1988 | Emmons et al. | 358/19 |
| 4,757,264 | 7/1988 | Lee et al. | |
| 4,772,950 | 9/1988 | Furuhata et al. | |
| 4,779,132 | 10/1988 | McBeath et al. | 358/148 |
| 4,827,341 | 5/1989 | Akimoto et al. | 358/148 |
| 4,996,596 | 2/1991 | Hirao et al. | 358/148 X |
| 5,008,751 | 4/1991 | Wischermann | 358/148 |
| 5,019,907 | 5/1991 | Murakoshi et al. | 358/158 |

FOREIGN PATENT DOCUMENTS 61-84183  4/1986  Japan .
61-139174 6/1986  Japan .

OTHER PUBLICATIONS

*Patent Abstracts of Japan,* vol. 6, No. 81, May 19, 1982 and JP-A-57 20 074 Feb. 2, 1982.

*Primary Examiner*—Victor R. Kostak
*Attorney, Agent, or Firm*—Burns, Doane, Swecker & Mathis

[57] ABSTRACT

A sampling clock generating circuit generates a sampling clock which is used for the A-D conversion of a video signal. A master clock produced by a frequency synthesizer is demultiplied in frequency at dividing ratio $N_S$ by a programmable frequency demultiplier which is reset by the horizontal sync signal. The resulting sampling clock can have one of various frequencies depending on the combination of the frequency dividing ratio $N_M$ of the frequency synthesizer and the frequency dividing ratio $N_S$ of the programmable frequency demultiplier, so that it is fit for various video signals.

9 Claims, 4 Drawing Sheets

SAMPLING CLOCK GENERATING CIRCUIT FOR A-D CONVERSION OF A VARIETY OF VIDEO SIGNALS

BACKGROUND OF THE INVENTION

1. Field of the Invention

The present invention relates to a sampling clock generating circuit for generating a sampling clock which is used for A-D conversion of various kinds of video signals.

2. Description of the Prior Art

FIG. 1 is a block diagram of a conventional sampling clock generating circuit. In the figure, indicated by 4 is a phase comparator for comparing the phase of a signal which is produced through the frequency demultiplication of the sampling clock with the phase of the horizontal sync signal so as to produce an error signal, 5 is a low-pass filter for smoothing the error signal, 6 is a voltage-controlled oscillator varying its oscillation frequency in response to the control voltage level, and 7 is a programmable frequency demultiplier which demultiplies the sampling clock frequency at a preset dividing ratio N.

Next, the operation of the circuit will be explained.

The sampling clock is demultiplied at a preset dividing ratio N in the programmable frequency demultiplier 7. The programmable frequency demultiplier 7 produces an output signal, which is compared in phase with the horizontal sync signal by the phase comparator 4, which then produces an error signal indicative of the phase difference between the two signals. The error signal is smoothed by the low-pass filter 5, and the resulting signal becomes the control voltage for the voltage-controlled oscillator 6. The voltage-controlled oscillator 6 varies its oscillation frequency in response to the control voltage. This circuit arrangement of a phase-locked loop (PLL) provides a sampling clock which is equal in phase with the horizontal sync signal and has a frequency N times the horizontal sync frequency.

It is difficult to design a voltage-controlled oscillator which operates stably in a wide frequency range. Therefore, in situations where the sampling clock is required to have a wide frequency range, either several voltage-controlled oscillators having various frequency ranges are selected by switching, or the sampling clock is extracted out of an intermediate stage of a programmable counter.

The conventional circuit as described above depends, for the stability of the sampling clock, largely on the stability of the externally-supplied horizontal sync signal. Thus, such sampling clocks can properly sample only video signals having stable horizontal sync signals.

In addition, there is another problem with conventional sampling clocks in that it is difficult to construct a stable PLL since different horizontal sync frequencies need different comparison frequencies.

SUMMARY OF THE INVENTION

The present invention is intended to solve the foregoing problems, and its prime object is to provide a sampling clock generating circuit that generates stable sampling clocks even in cases where externally-supplied horizontal sync signals have various frequencies or are instable.

The sampling clock generating circuit according to the present invention comprises a master clock oscillator based on the PLL frequency synthesizer which is able to generate frequencies, each of which is n(n: integer) times a stable reference frequency. The master clock oscillator produces a master clock signal which has one of the above frequencies, and the master clock signal is demultiplied by a programmable frequency demultiplier that is reset by the horizontal sync signal so as to produce a sampling clock.

The programmable demultiplier of this invention is reset by the externally-supplied horizontal sync signal, and operates to demultiply the master clock signal generated by the master clock oscillator so as to produce many kinds of sampling clocks which are equal in phase with the horizontal sync signals within an error of one clock period of the master clock.

DESCRIPTION OF THE PREFERRED EMBODIMENT

An embodiment of the present invention will be described with reference to the drawings.

Figure 1:
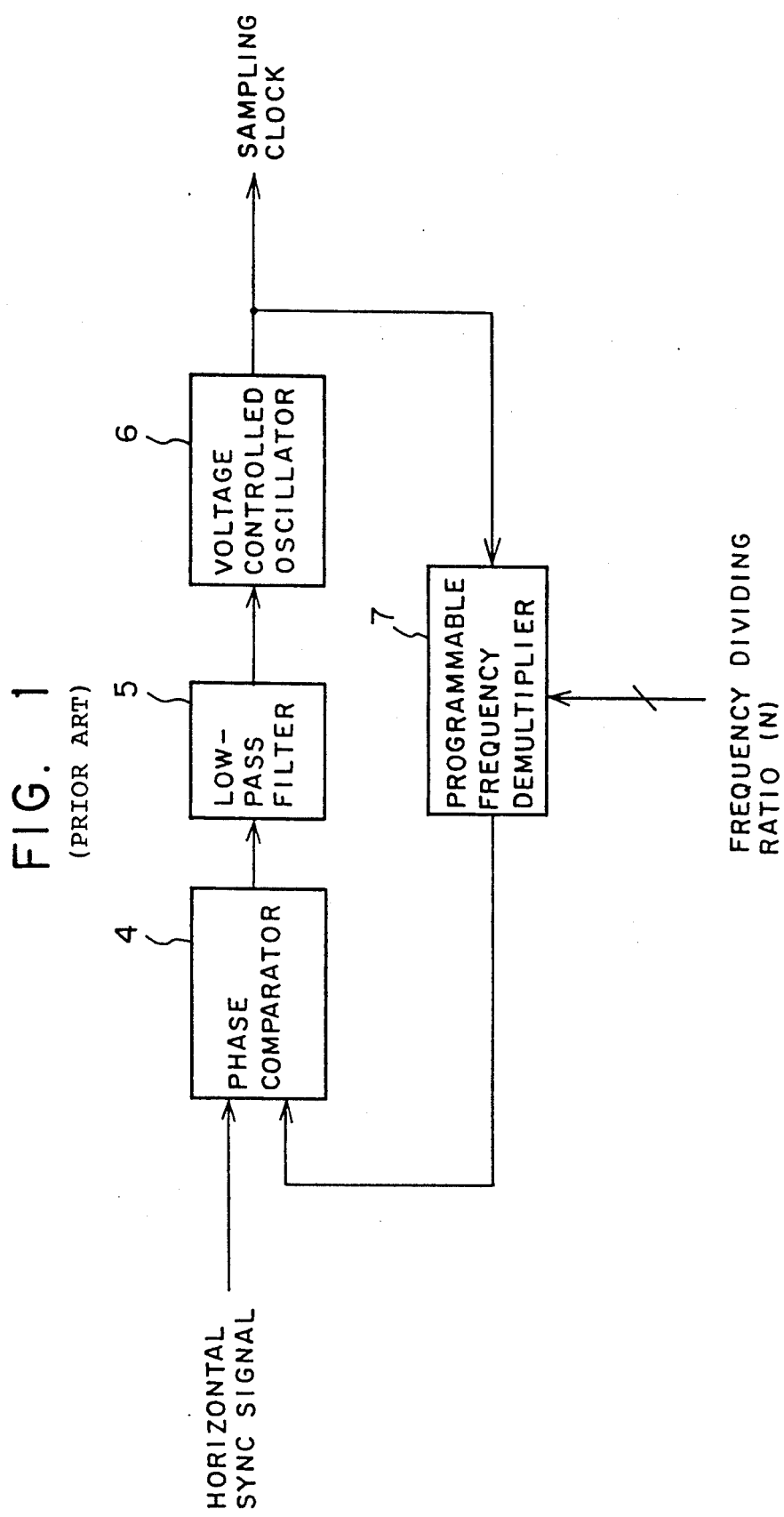
FIG. 1 is a block diagram showing the conventional sampling clock generating circuit.
Figure 2:
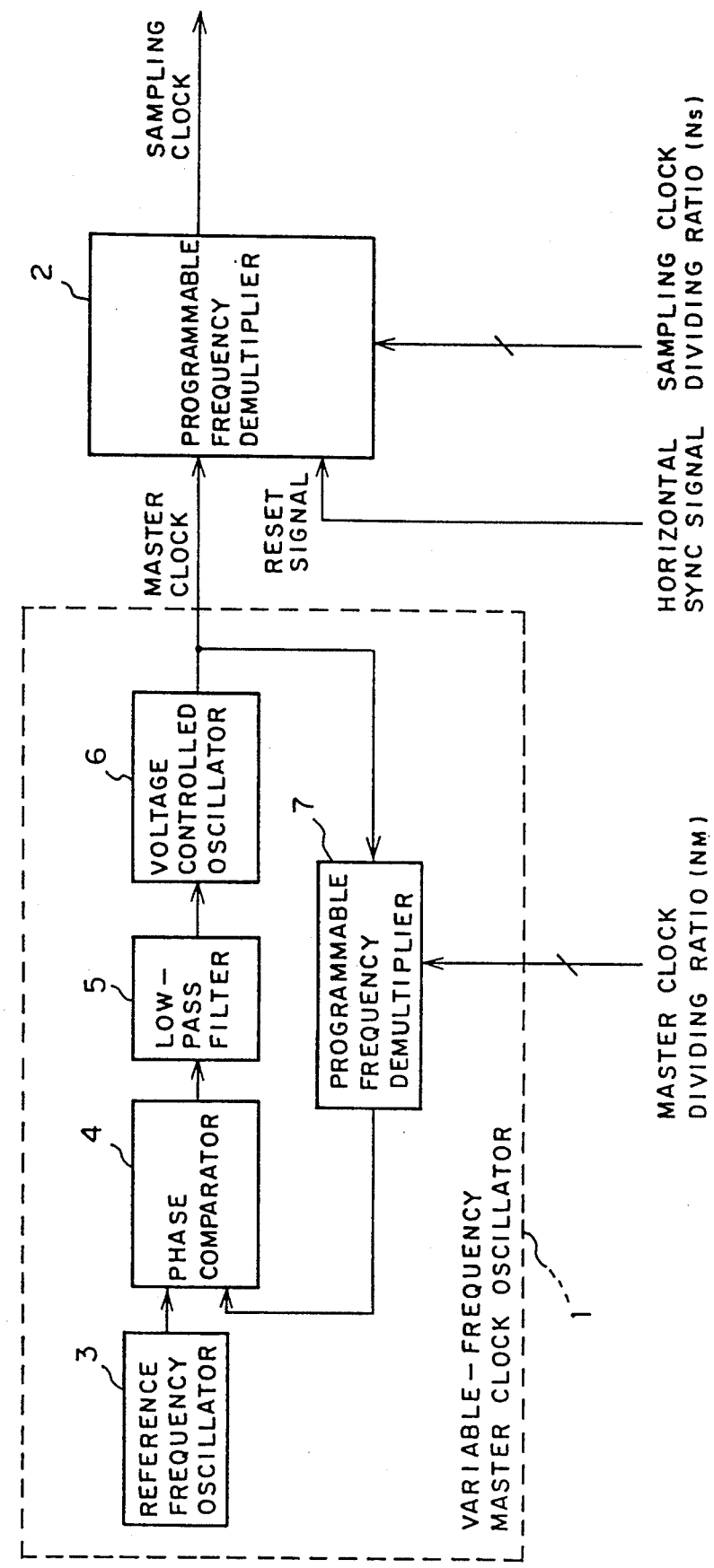
FIG. 2 is a block diagram showing the sampling clock generating circuit based on an embodiment of the present invention.

In FIG. 2, a block circuit is shown including a variable-frequency master clock oscillator 1 based on the scheme of frequency synthesizer, generating frequency which is $N_M$ times a reference frequency as a master clock frequency, and a programmable frequency demultiplier 2 which demultiplies the master clock frequency at a sampling clock dividing ratio $N_S$ to produce a sampling clock. The ratio $N_S$ is set from outside and is reset by a horizontal sync signal which is provided for from outside the circuit. The master clock oscillator 1 includes a reference frequency oscillator 3, such as a crystal oscillator, a phase comparator 4 which compares the phase of a signal, which is derived through demultiplication from the master clock, with the phase of the reference clock so as to produce an error signal, a low-pass filter 5 which smoothes the error signal, a voltage-controlled oscillator 6 which varies the oscillation frequency in response to the control voltage level, and a programmable demultiplier 7 which demultiplies the master clock frequency at a frequency dividing ratio $N_M$.

Next, the operation of the circuit will be explained.

The master clock oscillator 1 is of PLL configuration, and it controls the master clock frequency so that the frequency becomes $N_M$ times the reference frequency. The reference frequency oscillator 3 generates a stable reference clock. The phase comparator 4 compares in phase the reference clock with the signal which is derived from the master clock through demultiplication by the programmable frequency demultiplier 7 at a preset dividing ratio $N_M$, and produces an error signal indicative of the phase difference of the two signals. The error signal is smoothed by the low-pass filter 5, and it becomes the control voltage for the voltage-controlled oscillator 6. The voltage-controlled oscillator 6 varies its oscillation frequency in response to the control voltage.

In this manner, the master clock frequency is controlled to be a frequency which is $N_M$ times the reference frequency. The programmable frequency demultiplier 2 is reset by the horizontal sync signal, and demultiplies the master clock at the preset sampling clock dividing ratio $N_S$ so as to produce a sampling clock.

Figure 3:
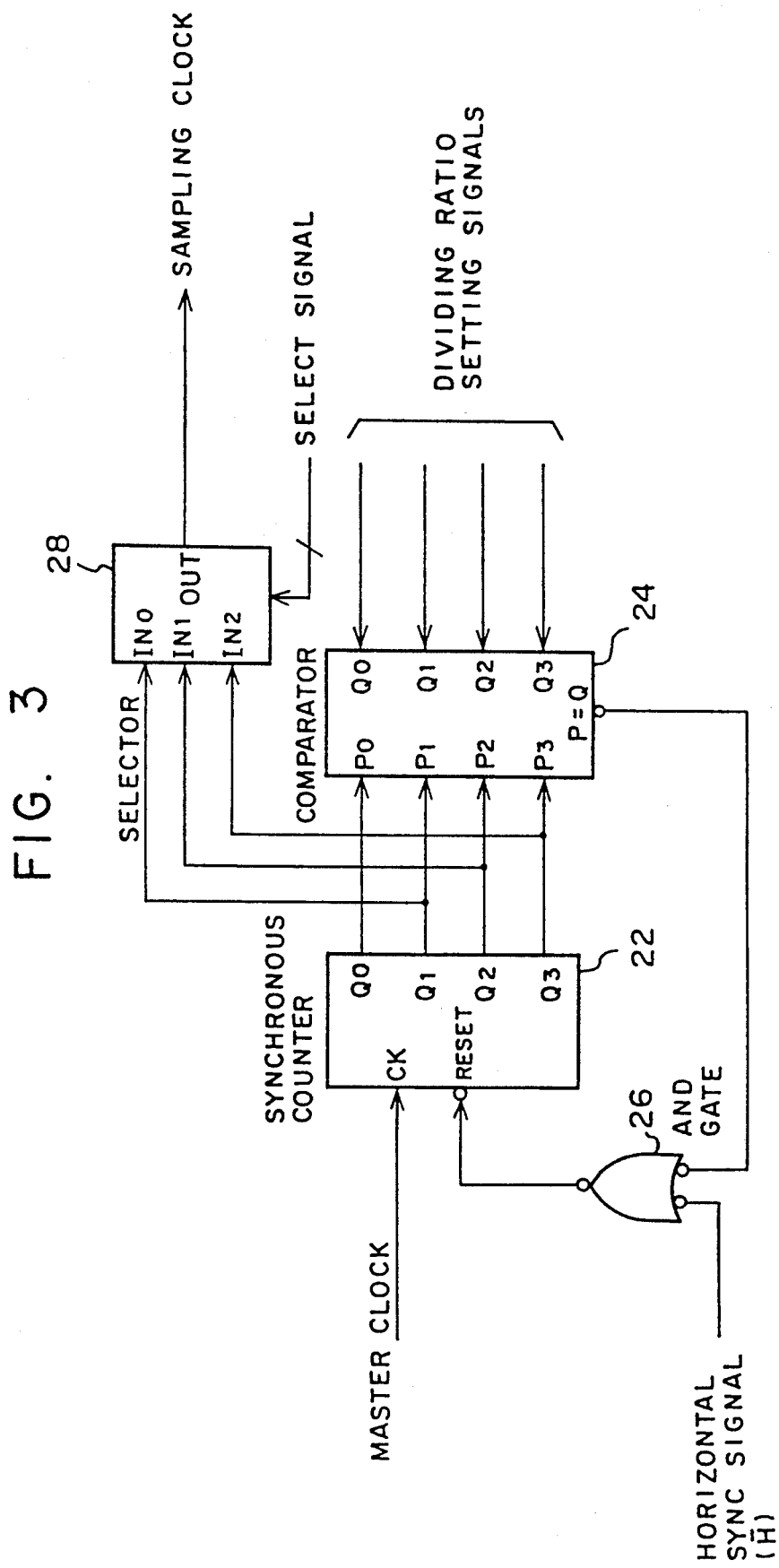
FIG. 3 is a circuit diagram showing an example of the programmable frequency demultiplier.

FIG. 3 is a circuit diagram showing, as an example, the arrangement of the programmable frequency demultiplier 2. In the circuit arrangement, a synchronous counter 22 is reset by the horizontal sync signal and counts the master clock signal. The count value is compared with a preset frequency dividing ratio by the comparator 24, which produces a coincidence signal when the two values are equal. The preset dividing ratio is a ratio which is decided by modifying the ratio $N_S$ to match this particular circuit. The coincidence signal is used to reset the counter by way of an AND gate 26.

These operations are repeated until the next horizontal sync signal is applied. From the outputs of the counter 22, an output which matches the dividing ratio $N_S$ is selected as the sampling clock by a selector 28.

Figure 4:
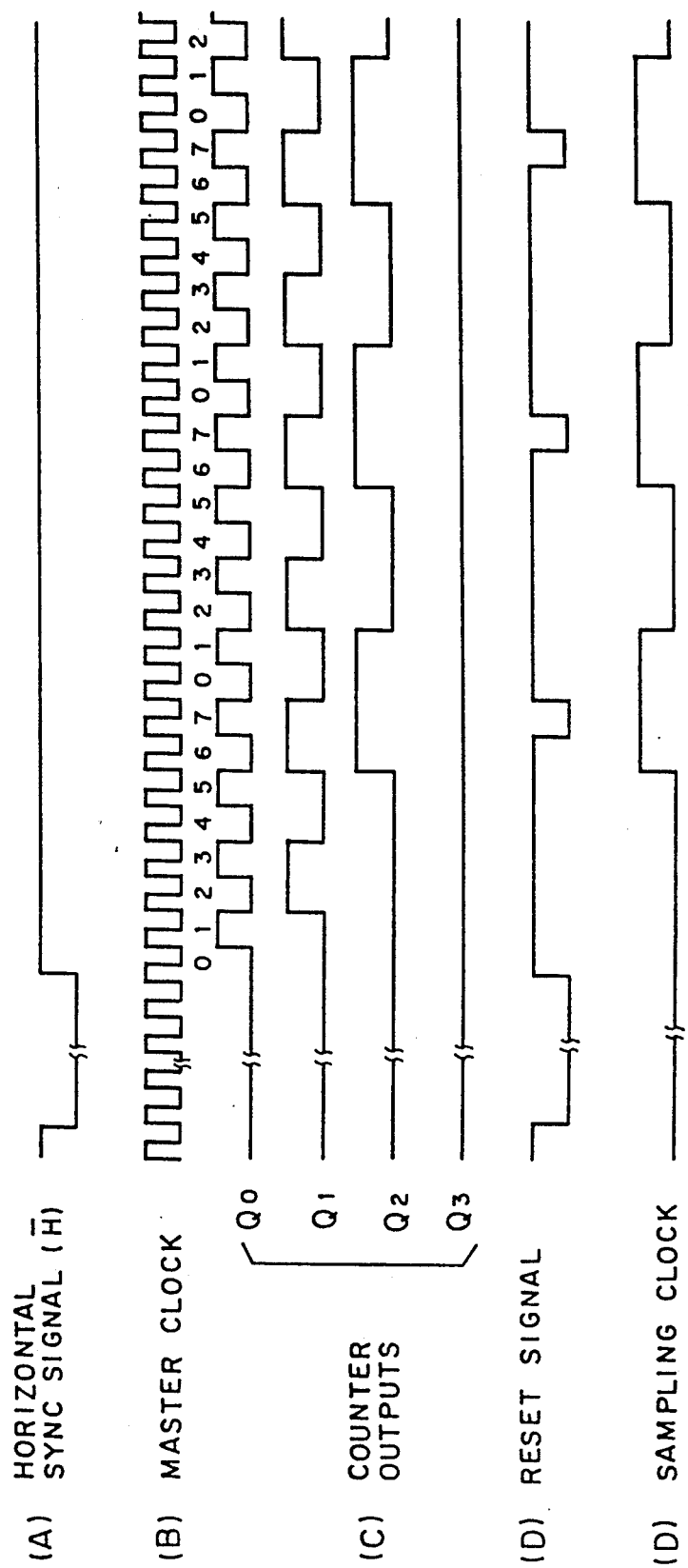
FIG. 4 is a timing chart showing, as an example, the operation of the programmable frequency demultiplier.

FIG. 4 is a timing chart showing the waveforms of various signals of the case where the frequency dividing ratio $N_S$ is 8, i.e., the preset frequency dividing ratio is 7. In this case, the selector 28 selects output $Q_2$ of the counter 22.

In case, for example, master clock frequency varies in the range of 100–80% of the maximum frequency, the sampling clock frequency can take the range of 25–10% of the maximum master clock frequency through the setting of frequency dividing ratios 4, 5, 6, 7 and 8 for the programmable frequency demultiplier 2. If a frequency demultiplication circuit is added at the later stage of the programmable frequency demultiplier 2, a sampling clock having an even lower frequency range can be generated.

In this way, a sampling clock equal in phase with a horizontal sync signal within an error of one clock period of a master clock, and having a frequency $N_M/N_S$ times the reference frequency can be produced.

As described above, according to the present invention, a master clock generated at a variable-frequency master clock oscillator based on the frequency synthesizer which can generate variable frequencies that are multiples of a stable reference frequency is demultiplied by a programmable frequency demultiplier that is reset by the horizontal sync signal inputted from the outside, whereby a sampling clock is produced. Accordingly, the present invention has the effect that a sampling clock having a stable and various range of frequencies can be obtained irrespective of the stability of the horizontal sync signal.

What is claimed is:

1. A sampling clock generating circuit for generating a sampling clock which is used for the A–D conversion of a video signal, said circuit comprising:
    a variable-frequency master clock oscillator, including a frequency synthesizer having a programmable frequency demultiplier section in which a dividing ratio $N_m$ is set, for generating a preset frequency as a master clock frequency that is $N_m$ times a reference frequency; and
    a programmable frequency demultiplier, being reset by a horizontal sync signal of said video signal and in which a sampling clock dividing ratio N, is set, for demultiplying the frequency of a master clock provided by said master clock oscillator so as to produce the sampling clock.

2. A sampling clock generating circuit according to claim 1, wherein said programmable frequency demultiplier comprises a counter which is reset by the horizontal sync signal and a coincidence signal and counts the master clock, and a comparator which produces said coincidence signal when a count value of said counter coincides with a preset value that corresponds to a sampling clock dividing ratio $N_s$.

3. A sampling clock generating circuit according to claim 1, wherein said frequency synthesizer further comprises:
    a phase-locked loop; and
    a reference frequency oscillator for supplying the reference frequency as an input to said phase-locked loop.

4. A sampling clock generating circuit according to claim 3, wherein said programmable frequency demultiplier is disposed outside of said phase-locked loop and receives the master clock frequency from said phase-locked loop.

5. A sampling clock generating circuit according to claim 1, wherein said dividing ratio $N_m$ and said dividing ratio $N_s$ are integers.

6. A sampling clock generating circuit comprising:
    master clock oscillator means for generating a master clock signal that has a frequency which is a predetermined number of times greater than a reference frequency; and
    programmable frequency dividing means for receiving and demultiplying said master clock signal to produce a sampling clock signal, wherein said programmable frequency dividing means comprises reset means for resetting said programmable frequency dividing means based on a horizontal sync signal.

7. A sampling clock generating circuit according to claim 6, wherein said master clock oscillator means further comprises:
    a phase-locked loop; and
    a reference frequency oscillator means for supplying the reference frequency to said phase-locked loop.

8. A sampling clock circuit according to claim 7, wherein said programmable frequency dividing means is disposed outside of said phase-locked loop and receives the master clock signal from said phase-locked loop.

9. A sampling clock circuit according to claim 6, wherein said control means further comprises:
    a counter which is reset by the horizontal sync signal and a coincidence signal and counts pulses of the master clock signal, and a comparator which produces said coincidence signal when a count value of said counter coincides with a preset sampling clock dividing ratio $N_s$.

* * * * *